United States Patent [19]

Peter et al.

[11] Patent Number: 4,951,188
[45] Date of Patent: Aug. 21, 1990

[54] FINAL STAGE OF A BRIDGE CIRCUIT

[75] Inventors: Cornelius Peter, Ottersweierr; Thomas Riehemann, Bühlertal, both of Fed. Rep. of Germany

[73] Assignee: Robert Bosch GmbH, Stuttgart, Fed. Rep. of Germany

[21] Appl. No.: 314,576

[22] PCT Filed: Jun. 20, 1987

[86] PCT No.: PCT/DE87/00282
§ 371 Date: Jan. 20, 1989
§ 102(e) Date: Jan. 20, 1989

[87] PCT Pub. No.: WO88/00770
PCT Pub. Date: Jan. 28, 1988

[30] Foreign Application Priority Data

Jul. 24, 1986 [DE] Fed. Rep. of Germany ....... 3625091

[51] Int. Cl.$^5$ .................................... H02M 7/5387
[52] U.S. Cl. .................................... 363/132; 363/17; 363/58; 363/98
[58] Field of Search ................ 363/17, 55, 58, 98, 363/132; 318/800, 801, 802, 803, 808, 809, 810, 811, 812; 323/268

[56] References Cited

U.S. PATENT DOCUMENTS

| | | | |
|---|---|---|---|
| 4,520,255 | 5/1985 | Bredenkamp et al. | 363/132 X |
| 4,545,004 | 10/1985 | Kade et al. | 363/132 X |
| 4,649,321 | 3/1987 | Ferraro | 363/132 X |
| 4,672,524 | 6/1987 | Toriyama et al. | 363/132 X |

FOREIGN PATENT DOCUMENTS 00385624 10/1981 European Pat. Off. .

Primary Examiner—Mark O. Budd
Assistant Examiner—Emanuel Todd Voeltz
Attorney, Agent, or Firm—Michael J. Striker

[57] ABSTRACT

In a device for controlling and regulating the current through an electric consumer with a bridge circuit, the consumer being located in one of its diagonals, four current control members of the logic level power MOS-FET type are provided, a pair of voltage regulating circuits for the gate voltage supply and a pair of current control circuits for the gate voltage control being connected respectively, two of to the four current control members. Each of the voltage regulating circuits is assembled of a diode having its anode connected to a d.c. power source and to the collector of a N-P-N transistor and, via a resistor, to the base of the transistor and to the cathode of a Zener diode whose anode is connected to a terminal of the consumer. The emitter of the transistor is connected to the gate of the assigned current control member.

13 Claims, 6 Drawing Sheets

FINAL STAGE OF A BRIDGE CIRCUIT

PRIOR ART

The invention concerns a device for controlling and regulating the current through an electromagnetic consumer with a bridge circuit consisting of four current control members, the consumer being located in one of its diagonals, as known e.g. from the DE-OS 34 20 611. In the known device, a diagonal of the bridge circuit comprises only the electromagnetic consumer, and a series connection consisting of an additional current control member and a measuring resistor is connected downstream of this bridge circuit. By means of this, the control of the current through the consumer and the control of the polarity of this current are to be separated in a manner related to circuit arrangement. The current control members in the known bridge circuit are bipolar transistors, specifically two p-n-p transistors and two n-p-n transistors. For turning on and turning off, such bipolar transistors require an energy loss which is converted in the transistors during the switching process.

In addition, a bridge circuit consisting of four bipolar transistors is known from the U.S. Pat. No. 4,520,438, a motor being connected in its diagonal. A base-current shunt transistor is connected in series with an inductance and a diode to each of these transistors via its base-emitter junction. The object of the circuit known from the U.S. Pat. No. 4,520,438 is that the base driver current should change as little as possible during a change in the operating conditions.

The relatively high energy loss of the connected transistors of the bridge circuit poses a problem when it involves low power loss as, for example, in electromagnetic consumers in motor vehicles or in connection with computers. In addition, the aforementioned texts make no mention of a protection for the final stage against short circuiting.

ADVANTAGES OF THE INVENTION

The device, according to the invention, for controlling and regulating current through an electromagnetic consumer with a bridge circuit, the consumer being located in one of its diagonals, consisting of four current control members of the logic level power MOSFET type, to which a voltage regulating circuit for the gate voltage supply and a current control circuit for the gate voltage control are connected, and comprising at least one measuring resistor connected to a connection point of the second diagonal has the advantage over the prior art that only an extremely low power loss is required for operating the circuit because of the extremely low resistance of such power MOSFETs. The measuring resistor can also have a very low resistance value. The gate voltage supply via voltage regulators permits a slight voltage drop of typically 1.2 Volts and an input protection against negative voltages. As a result of the gate voltage control via current sources, no problems occur because of disturbances in the supply voltage and only a low power loss of the drive circuit is required. Another advantage consists in that the device, according to the invention, can operate within a wide voltage range which is defined, at most, by the dielectric strength of the current control members of the final stage.

If the voltage regulating circuit comprises an integrated switching circuit, according to an advantageous embodiment of the device, according to the invention, this results in a particularly simple construction.

In another advantageous construction of the invention, the voltage regulating circuit is constructed from discrete components and comprises a diode whose cathode is connected to the collector of an n-p-n transistor and to a resistor whose other terminal is connected to the base of the transistor, with which the cathode of a Zener diode is connected. Such a construction can be hybridized or integrated in a particularly simple manner, since the capacitance of the gate voltage capacitor for the logic level power MOSFET current control members can be reduced by a factor of 1000 compared with the capacitance required in an integrated switching circuit.

This capacitance is the essential element of a voltage increase circuit (bootstrap) for the gate driving of the current control members. In an advantageous manner, this capacitance is only charged during the turn-off time of the current control members.

In another advantageous construction of the invention it is provided that the current control circuit comprises a current source circuit which can be turned on and off by a comparator circuit. Accordingly, a control which is adapted to the different operating conditions can be achieved; moreover, the current control circuit can be constructed in a simple manner from only a few components.

A particularly important advantage results, according to another advantageous construction of the invention, when a current monitoring circuit is provided which comprises a comparator circuit which switches through during a maximum current and discharges a capacitor and blocks the current control members via the other comparator circuit. That is, by means of a suitable dimensioning of the charging and discharging time constants of the capacitor, a turn-on pulse duty factor of typically 1% can be achieved in the event of a short circuit of the electromagnetic consumer.

If, according to another advantageous construction of the invention, a correction circuit for achieving an offset correcting voltage is provided, which offset correcting voltage is applied to the input of the comparator circuit of the current monitoring circuit, such that a very fast current measurement can be effected without common-mode interferences, as well as a detection of the free-running currents of the electromagnetic consumer without the occurrence of switching peaks.

Another substantial advantage of the invention results from a diagnostic circuit with a differential amplifier for detecting the current through the consumer as voltage with respect to ground, the diagnostic circuit being connected to a measuring resistor. A simple diagnosis of the current operating parameters of the electromagnetic consumer can accordingly be achieved for controlling and regulating purposes; particularly in connection with another advantageous construction of the invention in which a diagnostic circuit, which is connected to a measuring resistor, is provided with a differential amplifier for detecting the current through the consumer as inverted voltage with respect to the supply voltage. This enables a complete diagnosis of the final stage of the bridge circuit in which, if the consumer is a motor, a motor by-pass, a by-pass to ground, and a by-pass to the supply voltage can be reliably detected.

Also, the free-running currents of the electromagnetic consumer can be detected in the diagnosis if another diagnostic circuit, which is connected to the measuring resistor, is provided with a differential amplifier for detecting these free-running currents.

It is also possible to relate the free-running phases (negative voltage drops) to ground in an unobjectionable without problems if the correction circuit and a current level circuit arranged subsequent to the latter are connected between the measuring resistor and the one and/or the other diagnostic circuit. In so doing, the correction circuit provides for a positive bias for the current level circuit which can only process positive voltage drops at the measuring resistor. A particular advantage consists in that switching peaks, which would otherwise be present, disappear during the transition from a negative to a positive voltage drop.

In another advantageous construction of the invention, a switching connection is provided in the current source circuit, the electromagnetic consumer being bridged in the uninterrupted state of the switching connection, so that by actuating an external switch (preferably electronic switch) a deceleration of the electromagnetic consumer results on the basis of the law of induction.

Another embodiment form of the invention in which a positive offset voltage is connected to the non-inverting inputs of the differential amplifier of the diagnostic circuit at the level of the expected zero offset voltage is advantageous particularly when the device, according to the invention, is used in microcomputer systems. Even when no current flows in the bridge, a positive voltage is applied to the outputs of the differential amplifier regardless of the polarity of the zero offset voltage, which positive voltage can be read in by a microcomputer, e.g. via an analog-to-digital converter, and can be mathematically subtracted in calculations, e.g. for current regulation, and can thus be confirmed.

Another increase in the operating reliability of the device, according to the invention, can be achieved by means of using current control members with an integrated temperature protection arrangement. Power transistors are currently known and being marketed containing temperature sensors with thyristor characteristics so that they have protection against excessive temperatures. In this case, the circuit is also protected against creeping short circuits, that is, currents which are slightly below the turn-off threshold.

The fact that the device, according to the invention, can be integrated or hybridized in a relatively simple manner because of its low energy requirement is of particular significance, since low-power components whose total energy requirement lies far below 300 mW are used exclusively in the drive circuit.

Finally, another important advantage of the device, according to the invention, should be noted, which consists in that the device, according to the invention, can be used together with microcomputers in a particularly simple manner because of the use of logic level power MOSFETs.

DRAWING

The invention is explained in more detail in the following by means of the embodiment examples shown in the drawing, from which additional advantages and features follow.

DESCRIPTION OF THE EMBODIMENT EXAMPLES

The embodiment examples concern devices for controlling and regulating the current through an electromagnetic consumer in connection with internal combustion engines. The electromagnetic consumer can be a throttle valve control for a so-called "electronic gas pedal", for example.

Figures 1, 1A:
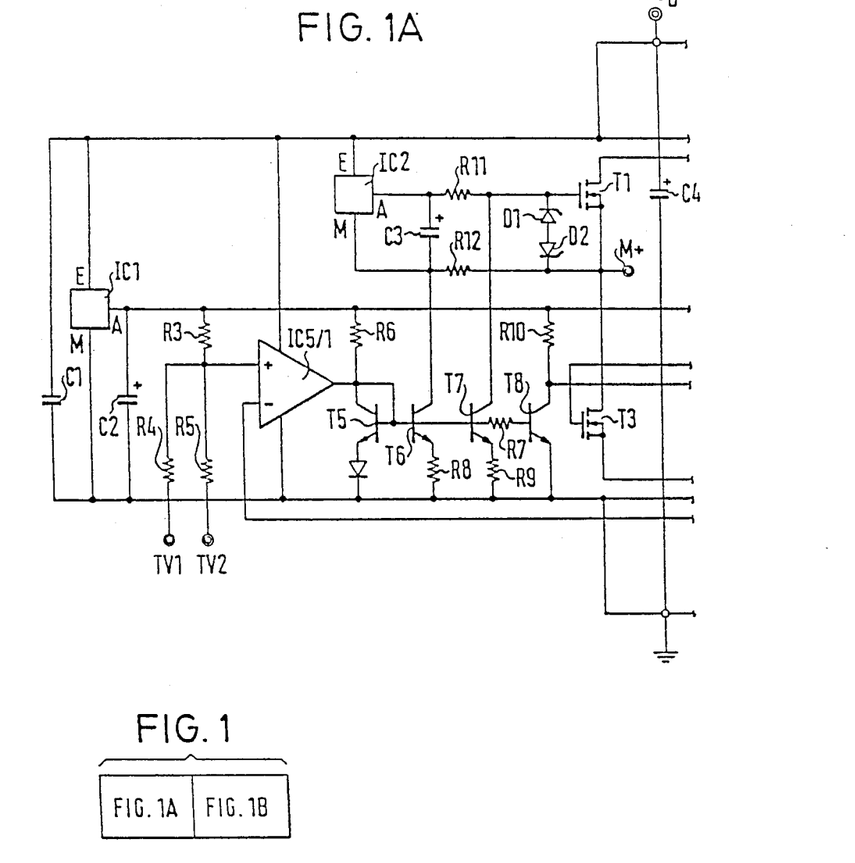
FIGS. 1A and 1B show a first embodiment example of the device, according to the invention.
Figure 1B:
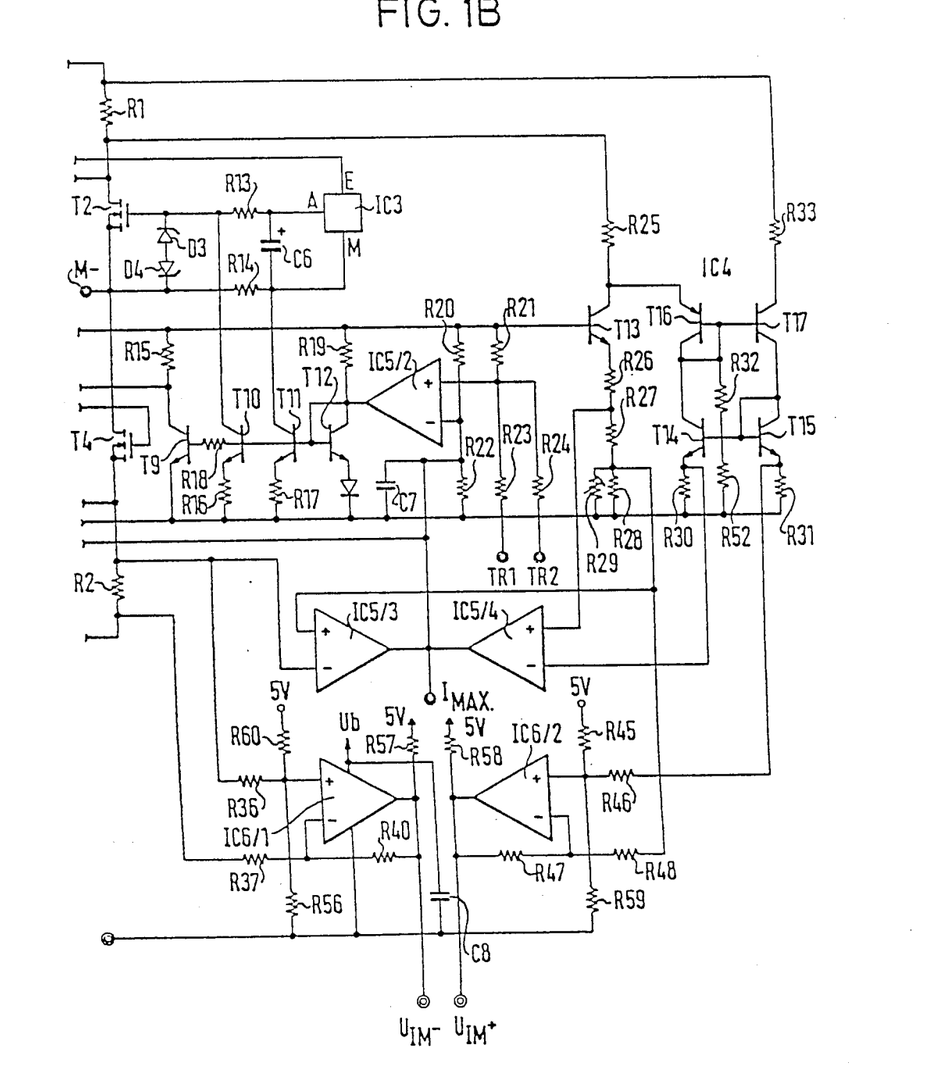

In FIG. 1, a 5-volt voltage source, which can also be realized in another construction, is designated by IC1. An input E of the integrated circuit IC1 is connected with the voltage supply $+U_B$, an input M is connected with the ground of the circuit via a collecting line, and an output A of the IC1 is bridged to ground via a capacitor C2. In addition, a voltage divider consisting of resistors R3, R4 and R5 is connected to the output A of the IC1. The other respective terminal of the resistors R4 and R5 leads to free connection points TV1 and TV2, respectively, which are open in the turn-off phase of the electromagnetic consumer. In addition, the resistor R3 is connected by its end, which is remote of the output A of the IC1, with the non-inverting input (−) of an integrated circuit IC5/1. A negative input of the IC5/1 is applied to a voltage activated in order to ensure that the final stage can only be driven when both TV1 and TV2, or TR1 and TR2 are at a low level. IC5/1 is a comparator which controls the current sources for the current control members (final stage transistors) T1 and T4.

Figure 4:
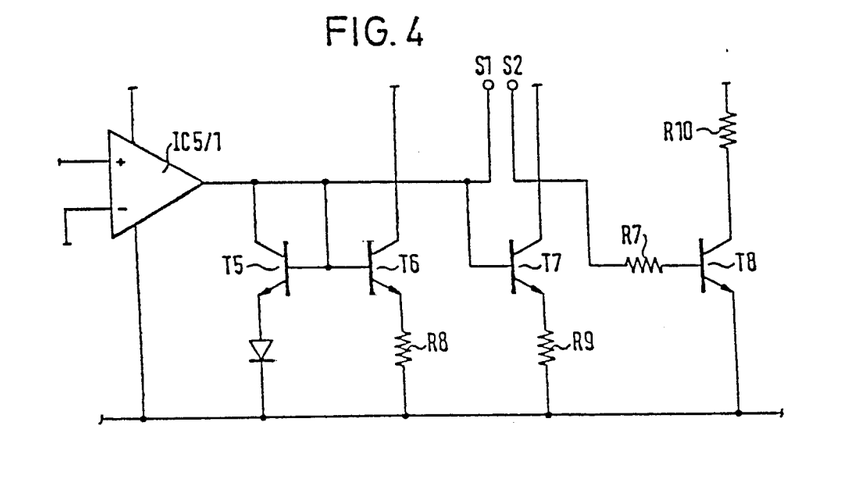
FIG. 4 shows an embodiment example of a current source circuit for driving controlling the gate voltage with switching connections for a deceleration of the electromagnetic consumer.

The current source circuit connected to the output of the IC5/1 consists of the transistors T5, T6 and T7 and supplies two currents of 5 mA to the nodal points of the gate voltage supply of the transistor T1. In the embodiment examples shown in FIGS. 1 and 2, the output of the IC5/1 is connected to every base of the transistors T5, T6 and T7 and, via a resistor R7, to the base of another transistor T8. In FIG. 4, another embodiment form is illustrated in which the supply of the base of T8 via switching contacts S1, S2 is interrupted and a deceleration of rotation of the electromagnetic consumer (an electric motor) can thus be achieved as it will be explained later.

The four final stage transistors T1, T2, T3 and T4 are arranged in a bridge circuit. The transistors T1, T2, T3 and T4 are identical and each is of the logic level MOSFET type. A Siemens power MOSFET (SIPMOS) of the BUZ 71 L type (L=logic) was selected and comprises an advantageously low drain source resistance $R_{DSon}$ of typically 90 milliohms. The power loss can be reduced even further if a SIPMOS type BUZ 10 L is used with a resistance $R_{DSon}$ of typically 40 milliohms.

The SIPMOS transistors T1 to T4 require a voltage elevation circuit (bootstrap) for the gate driving. For this purpose, a gate voltage capacitor C3, which is charged via a voltage regulator IC2, is provided for the SIPMOS transistor T1. These voltage regulators IC2 are constructed as integrated switching circuits in FIGS. 1 and 2; FIG. 3 shows an embodiment example for a construction of these voltage regulators from discrete components. In FIG. 1, an input E of the voltage regulator IC2 is connected to the voltage supply $U_B$. The connections A and M of the IC2 are bridged by the gate voltage capacitor C3 whose positive terminal is applied to the connection A of the IC2. In addition, a resistor R11 is connected to the connection A of the IC2, its other end leading to the gate terminal of the SIPMOS transistor T1. Another resistor R12 is connected at one end thereof to the terminal M of the IC2 and the negative connection of the capacitor C3 and is connected at its other end with the source terminal of the transistor T1 and a terminal M+ for the connection of an electromagnetic consumer. Two Zener diodes D1 and D2 which are connected in opposite directions lie between the gate terminal of the transistor T1 and the terminal M+. In addition, the collector of the current source transistor T6 is terminal to the negative connection of the capacitor C3 and the collector of the current source transistor T7 is connected with the gate terminal of the SIPMOS transistor T1.

In a corresponding manner, a voltage regulator IC3 is provided with a gate voltage capacitor C6 for supplying the gate voltage of the SIPMOS transistor T2; the other connections of the transistor T2 are executed in a manner analogous to the transistor T1. Accordingly, a current source circuit T12, T11 and T10 controlled by IC5/2 is provided for the SIPMOS transistor T2, wherein another transistor T9, which is controlled by IC5/2, switches the SIPMOS transistor T3. Connection terminals TR1 and TR2, respectively, are provided for actuating the IC2 ("backward" with reference to the rotational direction of an electromagnetic consumer which is connected to the terminals M+ and M− of the bridge circuit).

A measuring resistor R1 is connected to the drain terminals of the transistors T1 and T2 and, by its other end, to the power supply voltage $U_B$; another measuring resistor R2 is connected to the source terminals of the SIPMOS transistors T3 and T4 by one end and to power ground by its other end. These two measuring resistors R1, R2 which are arranged in a diagonal of the bridge circuit symmetrically with respect to the power supply serve to detect the currents IM+ or IM−, respectively, through an electromagnetic consumer, which is connected to the terminals M+ and M− in the other diagonal of the bridge circuit, in a manner discussed below.

The collector of a transistor T13 is connected, via a resistor R25, to the connection point of the measuring resistor R1 and the bridge circuit, the base of the transistor T13 being connected with the connection A of the IC1. The emitter of the transistor T13 is applied to a non-inverting input (+) of a comparator IC5/4 via a voltage divider circuit R26, R27, R28 and R29 (variable). The current source transistor T13, (which can only process positive voltage drops at R1) generates a positive bias for the current level circuit T14, T15, T16 and T17. This current level circuit can also be constructed in integrated form as IC4.

The voltage drop across the measuring resistor R1 is applied to ground by means of the current level circuit. The emitter of the current level monitoring transistor T14 is connected with the inverting input (−) of the IC5/4. The output of the comparator IC5/4 is connected with the output of another comparator IC5/3 and with a connection terminal $I_{MAX}$. The non-inverting input (+) of the IC5/3 is connected to the voltage divider R27, R28, R29 and the inverting input (−) is connected to the connection point of the measuring resistor R2 on the bridge.

Two differential amplifiers IC6/1 and IC6/2 are provided for monitoring the turn-on currents. The non-inverting input (+) of the IC6/2 is connected to the 5-Volt voltage supply via a resistor R45 and to the emitter of the current level monitoring transistor T15 via a resistor R46. The inverting input (−) of the IC6/2 leads to the voltage divider R27, R28, R29 via a resistor R48. The differential amplifier IC6/2 therefore supplies the turn-on current as inverted voltage with reference to +5 Volts. For this purpose, the output of the IC6/2 is connected to a connection terminal $U_{IM+}$, from which this voltage can be taken off. In a similar manner, the differential amplifier IC6/1 is connected by its non-inverting input (+) to the 5-Volt voltage supply via a resistor R60 and to the connection point of the measuring resistor R2 on the bridge via a resistor R36, the inverting input (−) of the differential amplifier IC6/1 is connected with the connection point of the measuring resistor R2 on the ground via a resistor R37. The differential amplifier IC6/1 therefore delivers a value for the turn-on current as inverted voltage, but so as to be measured at the ground point. In order to detect this voltage the output of IC6/1 is connected to a connection terminal $U_{IM-}$.

Figure 2:
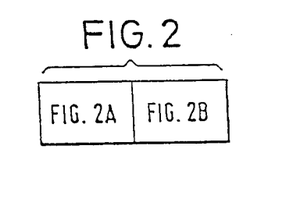
FIGS. 2A and 2B show another embodiment example with additional diagnostic devices.
Figure 2A:
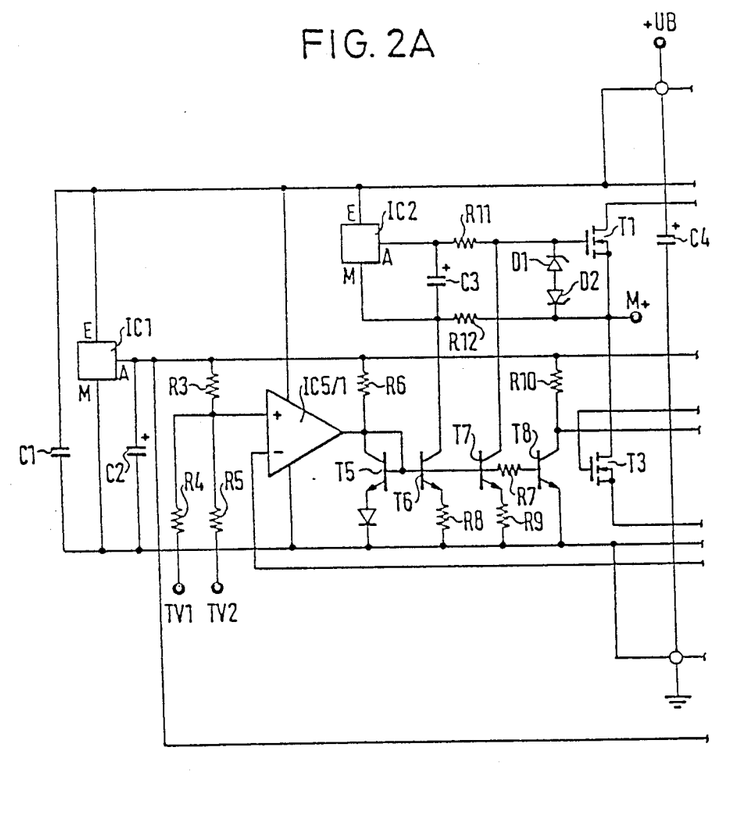
Figure 2B:
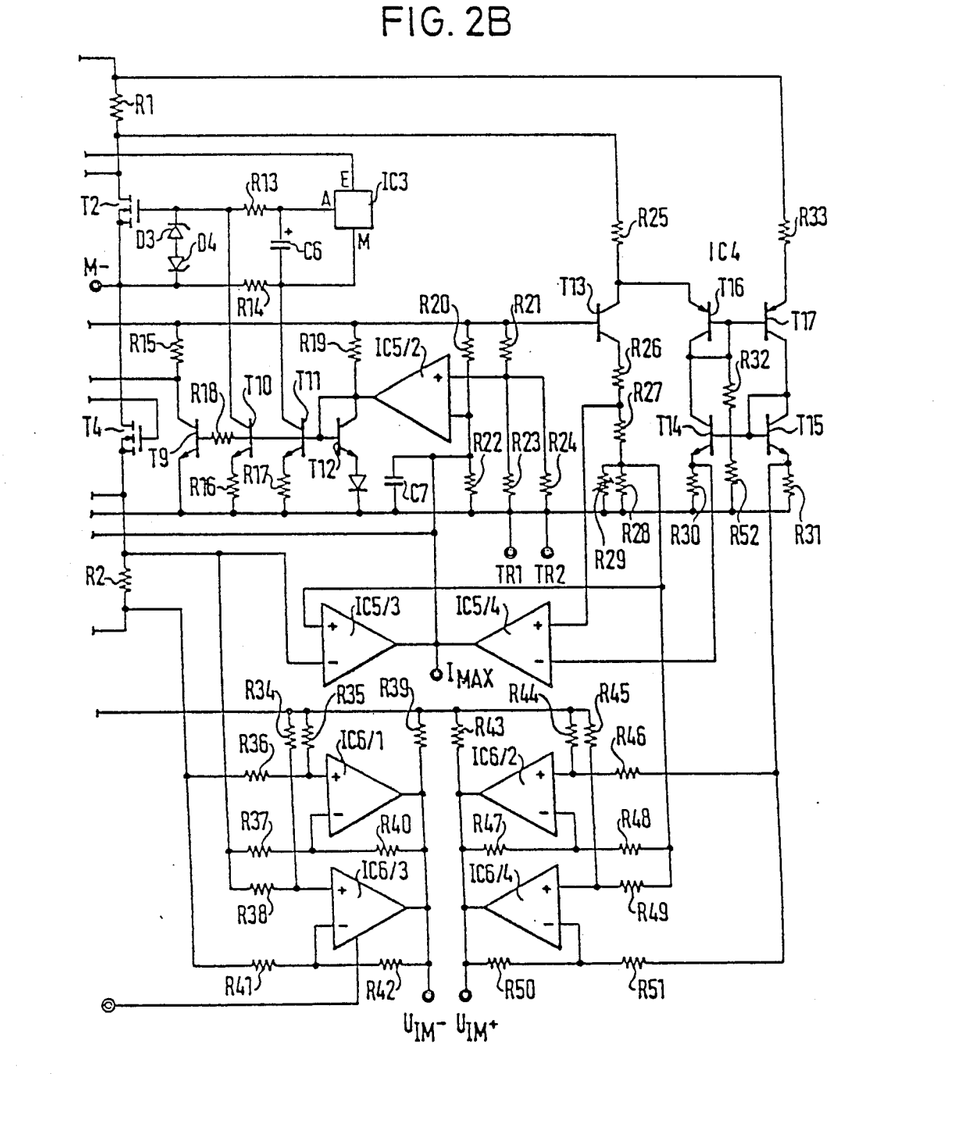
Figure 3:
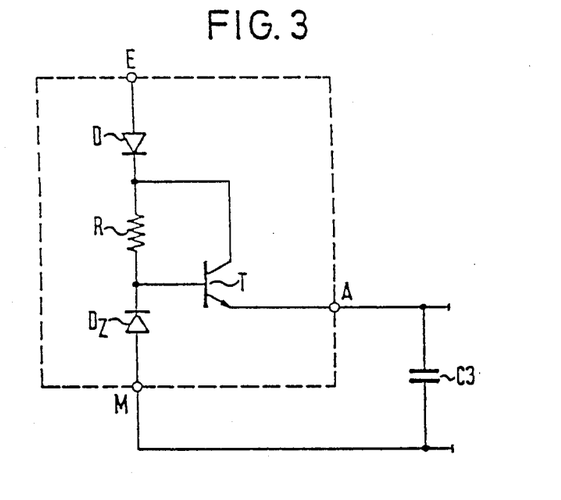
FIG. 3 shows an embodiment example of a voltage regulating circuit constructed with discrete components.

FIG. 2 shows another embodiment example of the device, according to the invention, in which, in addition to the components shown in FIG. 1 (which are therefore not mentioned in the following), two other differential amplifiers IC6/3 and IC6/4 are provided for detecting the free-running currents of the electromagnetic consumer which is connected to the connection terminals M+ and M− of the bridge circuit. For this purpose, the non-inverting input (+) of the IC6/4 is connected to the voltage divider R27, R28, R29 via a resistor R49 and the inverting input (−) of the IC6/4 is connected with the emitter of the current source transistor T15 via a resistor R51. The output of the differential amplifier IC6/4 is connected to the connection point $U_{IM+}$. In a similar manner, the differential amplifier IC6/3 is connected at its non-inverting input (+) with the connection point of the measuring resistor R2 on the bridge via a resistor R38 and is connected at its inverting input (−) with the connection point of the measuring resistor R2 on the ground via a resistor R41. The output of IC6/3 leads to the connection point $U_{IM-}$ in an analogous manner.

In a practical realization of the circuits shown in FIGS. 1 and 2, components were used with data or values, respectively, indicated in the following:

For the integrated circuits: IC1=IC2=IC3: 2931, IC4: CA 3096 AE, IC5: CA 139 and IC6: TAE 2453 (FIG. 1) and TAE 4453, respectively, (FIG. 2).

For the transistors: T1=T2=T3=T4: SIPMOS BUS 71L, T14, T15, T16, T17: either CA 3096 AE (integrated as indicated above) or discrete: T14=T15: BCV 61 (n-p-n current level) and T16=T17: BCV 62 (p-n-p current level).

For the resistors (values in ohms, e.g. R1=10 m: 10 milliohms) (in FIGS. 1 and 2): R1=10 m, R2=10 m, R3=2.1k, R4=10k, R5=10k, R6=780, R7=10k, R8=100, R9=100, R10=3.1k, R11=1.5k, R12=1.5k, R12=1.5k, R13=1.5k, R14=1.5k, R15=3.1k, R16=100, R17=100, R18=10k, R19=780, R20=210k, R21=2.1k, R22=680k, R23=10k, R24=10k, R25=100, R26=2.83k, R27=100, R28=110, R29=1k (variable), R30=2.05k, R31=2.05k, R32=1M, R33=2.15k. For the resistors (only in FIG. 1): R36=1.5k. R37=1.5k, R40=75k, R45=1M, R46=1.5k, R47=75k, R48=1.5k, R52=1M, R56=75k, R57=2k, R58=2k, R59=75k. For the resistors (only in FIG. 2): R34=215k, R35=215k, R36=4.3k, R37=4.3k, R38=4.3k, R39=4.64k, R40=215k, R41=4.3k, R42=215k, R43=4.64k, R44=215k, R45=215k, R46=4.3k, R47=215k, R48=4.3k, R49=4.3k, R50=215k, R51=4.3k, R52=1M.

For the capacitors (values in farads, e.g. C1=220 n: 220 nanofarads) (FIGS. 1 and 2): C1=220n, C2=100µ, C3=100µ, C4=220µ, C6=100µ, C7=3.3n, C8=100n.

The supply voltage $U_B$ was 12 Volts (permissible 5.5 to 38 V) and the maximum current was 18 A.

The operation of a circuit constructed as shown in FIGS. 1 and 2 is explained in the following, wherein the forward branch, which is actuated by means of the connection points TV1 and TV2, is considered in a representative manner; the same applies in a corresponding sense for the backward branch with actuation of terminals TR1, TR2. As already mentioned, the two gate voltage capacitors C3 and C6 are charged by means of the voltage regulators IC2 and IC3, but only during the turn-off time of the SIPMOS final stage transistors T1, T2, T3 and T4.

In the turn-off phase, the inputs TV1 and TV2, respectively, are open (at +5 Volts), IC5/1 blocks at the output (open collector) and the current source circuit T5, T6 and T7 supplies two currents of 5 mA to the nodal points of the gate voltage supply of the transistor T1. These two currents provide first for a turning off of the transistor T1 and secondly for a reliable charging of the capacitor C3 via the voltage regulator IC2, specifically for all occurring potentials (−0.7 Volts≦M++≦$U_B$+0.7 Volts) at the motor terminal M+. The SIPMOS transistor T4 is turned off via the transistor T8.

In the turn-on phase, TV1 and TV2 are connected to ground, IC5/1 switches off the current source T5, T6 and T7 as well as the control transistor T8. The gate of the SIPMOS transistor T1 is now supplied via the gate voltage capacitor C3 and the resistors R11/R12, while IC5/2 is inactive. The SIPMOS transistor T4 is driven via the resistor R10.

The comparator IC5/4 is corrected via the transistor T13 by the offset voltage $U_{Offset}$ and switches through when a maximum current $I_{MAX}$ is exceeded and discharges the capacitor C7. The capacitor C7 only begins to charge again after this maximum current is no longer exceeded. As long as the voltage at the capacitor C7 is less than approximately 3.5 Volts, the final stage is blocked by means of the comparators IC5/1 and IC5/2. The time constants for the charging and discharging times, respectively, of the capacitor C7 are selected in such a way that a turn-on pulse duty factor of 1% results in the event of a short circuit of the electromagnetic consumer located at the terminals M+, M− of the bridge circuit. A reliable short-circuit protection is accordingly ensured. If the transistors T1, T2, T3 and T4 in the bridge circuit are replaced by types with integrated temperature protection, the circuit is also protected against creeping short circuits, that is, currents lying just below the turn-off threshold. The "hard" turn-off at currents above $I_{MAX}$ can be operated via the corresponding connection terminal $I_{MAX}$.

In order to regulate the current, the instantaneous current IM of the electromagnetic consumer is generated from the voltage applied to the resistor R30 by means of the differential amplifier circuit. The differential amplifier IC6/2 supplies the turn-on current as inverted voltage with reference to $U_B$+5 Volts; in the event that the detection of the free-running current is desired, IC6/4 must be added (FIG. 2). The voltage $U_{IM}$ results through the following equation:

$$U_{IM} = 5 \text{ V} - 0.5 \text{ V} \times IM/A$$

The same current signal supplies the circuit with the differential amplifiers IC6/1 and IC6/3, but as voltage measured at the ground point.

If the electromagnetic consumer connected to the terminals M+, M− of the bridge circuit is an electric motor, for example, a complete diagnosis of the bridge final stage can be realized with the aid of the signals $U_{IM}+$ and $U_{IM}-$. That is, in a motor by-pass, $U_{IM}+$ is equal to $U_{IM}-$, but is increased during the turn-on phase. A by-pass to ground is indicated in that $U_{IM}+$ is greater than $U_{IM}-$. On the other hand, if $U_{IM}+$ is less than $U_{IM}-$ there is a by-pass to the supply voltage $U_B$.

However, a usable current regulation and diagnosis of the operating sequence is also possible without the detection of the free-running currents, in this case IC6/3 and IC6/4 can be dispensed with (FIG. 1).

The current flowing into the final stage produces a voltage drop at the measuring resistor R1, which voltage drop is referred to ground via the current level circuit T14, T15, T16, T17. Since the current level circuit can only process positive voltage drops at the measuring resistor R1, it is positively biased by means of the current source biasing circuit consisting of transistor T13 and resistor R25. In this way the free-running phases (negative voltage drops) can also be referred to ground without problems; in particular, switching peaks, which would otherwise be present, disappear during the transition from negative to positive voltage drops.

Figure 5:
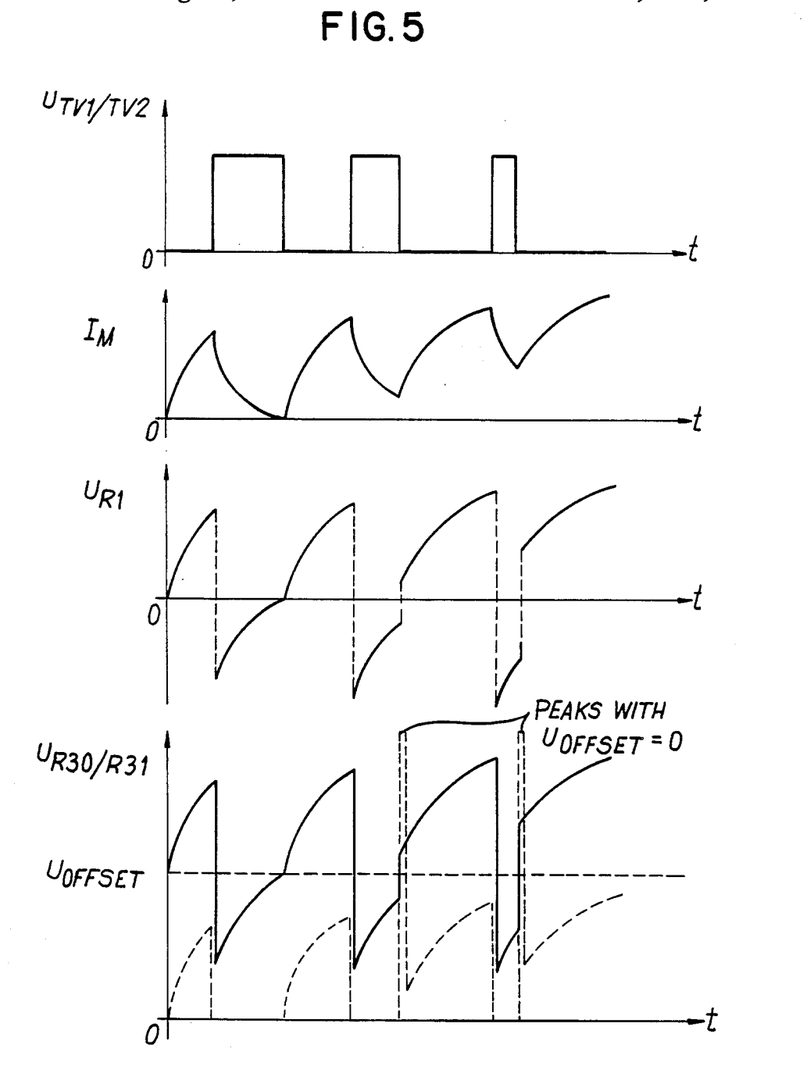
FIG. 5 shows time diagrams of voltages and currents occurring in operation.

Typical voltages and currents occurring in the described operation of the embodiment forms of the invention according to FIGS. 1 and 2 are shown schematically in the time diagrams of FIG. 5. The uppermost diagram shows the time plot of the voltage applied to the terminals TV1 or TV2, respectively. Below that, the corresponding time plot of the current IM through the electromagnetic consumer connected to the terminals M+, M− is shown. The time plot of the voltage dropping across the measuring resistor R1 is shown in the following diagram, and below the latter, in FIG. 5, the time plot of the voltage dropping across the resistors R30 and R31, respectively, is shown by a solid line, while the voltage configurations with unwanted peaks otherwise occurring at an offset voltage $U_{Offset}=0$ are shown for the purpose of explanation in dashed lines.

FIG. 3 shows another embodiment form of the voltage regulators IC2, IC3 shown in FIGS. 1 and 2 as integrated circuits. In FIG. 3, these voltage regulators are constructed discretely. The portion of the discretely constructed voltage regulator is shown in FIG. 3 by means of a rectangle with dashed lines, which voltage regulator can be inserted in the embodiment forms according to FIGS. 1 and 2 instead of the voltage regulators IC2, IC3 at the corresponding connections by the connections E, A and M.

The anode of a diode D, whose cathode is connected to a resistor R and to the collector of a transistor T, is connected with the connection point E. The other terminal of the resistor R is connected with the base of the transistor T and the cathode of a Zener diode $D_Z$, whose anode connection is guided to the connection point M. The emitter connection of the transistor T is connected with the connection point A. For the purpose of illustration, FIG. 3 shows the connection of the gate voltage capacitor C3, which is connected between the connection points A and M of the voltage regulator the the SIPMOS transistor T1 of FIGS. 1 and 2, respectively. A Schottky diode, e.g. of the BAT 85 type, with a low forward voltage of 0.2 to 0.3 V, is preferably used as diode D, so that a reliable input protection relative to negative voltages is also achieved. The transistor T, is an N-P-N transistor e.g. the BC 639 type and the Zener diode $D_Z$ can comprise a Zener voltage of 4.7 V. It should be particularly emphasized that the capacitance of the gate voltage capacitor C3 (and correspondingly C6) can be considerably reduced, that is, by a factor of 1000, in the embodiment form shown in FIG. 3 with the aforementioned components, so that the embodiment form C3 (and accordingly C6) shown in FIG. 3 need only have a capacitance of 100 nF. Accordingly, the voltage regulator and the entire circuit, respectively, can be integrated or hybridized in a considerably improved manner.

The circuit shown in FIG. 4 shows an additional embodiment form with a switching connection for the current source circuit T5, T6, T7 and the switch T8 of FIGS. 1 and 2. Of course, it is also possible to use the circuit shown in FIG. 4 in the current source circuit T12, T11, T10, which is constructed in an analogous manner, and the switch T9, respectively. The output of the comparator IC5/1 is connected to the base of the transistors T5, T6, T7 in each instance (as in FIGS. 1 and 2). However, in the embodiment form shown in FIG. 4, the additional connection of the output of IC5/1 to the resistor R7 and, via the latter, to the transistor T8 is interrupted and connected to the switching terminals S1, S2. If the electromagnetic consumer is a motor, the breaking of motor brake can be achieved by means of a switch which is connected to the terminals S1, S2. That is, if the connection of the terminal S1 to the terminal S2 is interrupted by opening the switch, the final stage transistors T3 and T4 become conductive simultaneously, compare FIGS. 1 and 2, so that the motor is bridged. This results in a deceleration of the motor in a known manner.

We claim:

1. Device for controlling the current through an electric consumer connected in a diagonal of a bridge circuit assembled of four current control members in the form of field effect transistors, comprising two gate voltage supply circuits each connected to the gate of a field effect transistor in two branches of the bridge circuit; two current source circuits connected, respectively, to the gate voltage supply circuits to control voltages supplied to the gates; each voltage supply circuit including a voltage regulator assembled of a diode (D) having its anode connected to the positive terminal of a power voltage source, its cathode connected to an end of a resistor (R) and to the collector of a N-P-N transistor (T), a Zener diode ($D_Z$) having its cathode connected to the other end of the resistor (R) and to the base of the N-P-N transistor (T), its anode connected via a resistor to a terminal of the electric consumer, and the emitter of the N-P-N transistor being connected via a resistor to the gate of the assigned field effect transistor.

2. A device as defined in claim 1 wherein a capacitor (C3, C6) is connected between the emitter of the transistor (T) and the anode of the Zener diode ($D_Z$).

3. A device as defined in claim 2 further comprising means for charging the capacitor (C3, C6) during the blocking of the four field effect transistors of the bridge circuit.

4. A device as defined in claim 3 further comprising current level monitoring means including a comparator (IC5/4) and another comparator (IC5/3) connected with and cooperating with said comparator (IC5/4) for charging another capacitor (C7) when the instantaneous current through the consumer is below a preset maximum current ($I_{MAX}$), and turning-on the current source circuits when the charge of the other capacitor exceeds a predetermined level.

5. A device as defined in claim 4 further comprising means for correcting offset voltage at the inputs of said comparator (IC5/4).

6. A device as defined in claim 5 wherein the other diagonal of the bridge circuit is connected to a power voltage supply ($U_B$) via a pair of symmetrically arranged measuring resistors and further comprising a first diagnostic circuit including a differential amplifier (IC6/1) having its inputs connected via a voltage divider to one (R2) of the measuring resistors and to the power voltage supply to deliver at its output an inverted voltage ($U_{IM}-$) with reference to ground, and the inverted voltage ($U_{IM}-$) being indicative of the instantaneous current (IM) through the consumer.

7. A device as defined in claim 6 further comprising a second diagnostic circuit including a differential amplifier (IC6/2) having its inputs connected via the current level monitoring means to the other (R1) measuring resistor and via a voltage divider to the power voltage supply to deliver at its output an inverted voltage ($U_{IM}+$) with reference to the power voltage ($U_B$) and the inverted voltage ($U_{IM}+$) being indicative of the instantaneous current through the consumer.

8. A device as defined in claim 7, further comprising third and fourth diagnostic circuits each including a differential amplifier (IC6/3, IC6/4) whose inputs are connected respectively via voltage dividers to the inputs of the differential amplifiers in the first and second diagnosis circuits to detect at their outputs free-running currents of the consumer.

9. A device as defined in claim 8 wherein the offset voltage correcting means are connected via a voltage divider to an input of the differential amplifiers in the first through fourth diagnostic circuits.

10. A device as defined in claim 7 wherein each of the current source circuits includes a switching comparator having its output connected to bases of current source transistors and of a control transistor which actuates the other pair of field effect transistors in the bridge circuit, one input of the switching comparator being connected to the first mentioned capacitor (C7) and the other input being connected to a source of switching voltage (TV1, TV2).

11. A device as defined in claim 10 wherein the connection of the output of respective switching comparators to the corresponding control transistors is interruptable by a switch.

12. A device as defined in claim 7 wherein a positive offset correcting voltage is applied to non-inverting inputs of respective first and second differential amplifiers (IC6/1, IC6/2) to provide a zero offset voltage thereon.

13. A device as defined in claim 1 wherein the current control members include an integrated temperature protection arrangement.

* * * * *